US012610694B2

(12) United States Patent　　　(10) Patent No.:　US 12,610,694 B2
Tabatake　　　　　　　　　　　　　(45) Date of Patent:　　Apr. 21, 2026

(54) METHOD OF MANUFACTURING DISPLAY DEVICE AND MOTHER SUBSTRATE

(71) Applicant: Magnolia White Corporation, Tokyo (JP)

(72) Inventor: Hiroshi Tabatake, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 285 days.

(21) Appl. No.: 18/307,817

(22) Filed: Apr. 27, 2023

(65) Prior Publication Data

US 2024/0090272 A1　　Mar. 14, 2024

(30) Foreign Application Priority Data

Apr. 28, 2022　(JP) ................................. 2022-074874

(51) Int. Cl.
　　*H10K 59/122*　　(2023.01)
　　*H10K 59/12*　　(2023.01)
(52) U.S. Cl.
　　CPC ....... *H10K 59/122* (2023.02); *H10K 59/1201* (2023.02)
(58) Field of Classification Search
　　CPC .......................... H10K 59/122; H10K 59/1201
　　USPC ......................................................... 257/40
　　See application file for complete search history.

(56) References Cited

U.S. PATENT DOCUMENTS 7,132,788 B2　11/2006　Gupta et al.
9,859,345 B2　1/2018　Lee et al.

2004/0160170 A1　8/2004　Sato et al.
2006/0135029 A1　6/2006　Harada
2009/0009069 A1　1/2009　Takata
2012/0223342 A1*　9/2012　Tanada ................... H10K 59/86
　　　　　　　　　　　　　　　　　　　257/40
2014/0091285 A1　4/2014　Shin et al.
2015/0380685 A1*　12/2015　Lee ...................... H10K 59/122
　　　　　　　　　　　　　　　　　　　257/40
2016/0040981 A1*　2/2016　Kang ........................ G01S 7/51
　　　　　　　　　　　　　　　　　　　455/414.1

(Continued)

FOREIGN PATENT DOCUMENTS

JP　　2000-195677 A　　7/2000
JP　　2004-207217 A　　7/2004

(Continued)

OTHER PUBLICATIONS

Taiwanese Office Action issued Mar. 12, 2024, in corresponding TW Application No. 112113572, 9 pages.

(Continued)

*Primary Examiner* — Dzung Tran
(74) *Attorney, Agent, or Firm* — XSENSUS LLP

(57)　　　ABSTRACT

According to one embodiment, a method of manufacturing a display device, includes forming a lower electrode on a base, forming a rib which covers a part of the lower electrode, forming a partition including a lower portion disposed on the rib and an upper portion protruding from a side surface of the lower portion, removing the upper portion of at least a part of the partition, measuring a first width of the lower portion of the partition and a second width of the upper portion of the partition and measuring a distance between the side surface of the lower portion and an end portion of the upper portion based on the first and second widths.

6 Claims, 13 Drawing Sheets

(56) References Cited

U.S. PATENT DOCUMENTS

| | | | |
|---|---|---|---|
| 2016/0079325 A1 * | 3/2016 | Lee ........................ | H10K 71/00 |
| | | | 438/26 |
| 2017/0125734 A1 * | 5/2017 | Lee .................... | H10K 59/8731 |
| 2018/0202035 A1 * | 7/2018 | Park ...................... | H01L 21/027 |
| 2019/0363275 A1 * | 11/2019 | Ochi ...................... | H05B 33/02 |
| 2022/0077251 A1 | 3/2022 | Choung et al. | |
| 2022/0416197 A1 * | 12/2022 | Chen ................. | H10K 59/1201 |

FOREIGN PATENT DOCUMENTS

| | | | |
|---|---|---|---|
| JP | 2007088127 | A | 4/2007 |
| JP | 2008-135325 | A | 6/2008 |
| JP | 2009-32673 | A | 2/2009 |
| JP | 2010-118191 | A | 5/2010 |
| JP | 2016091942 | A | 5/2016 |
| KR | 20060066641 | A | 6/2006 |
| WO | 2004084590 | A1 | 9/2004 |
| WO | 2018/179308 | A1 | 10/2018 |
| WO | 2022050983 | A1 | 3/2022 |

OTHER PUBLICATIONS

English translation of Korean Office Action issued Sep. 24, 2024, in corresponding Korean Patent Application No. 10-2023-0053846, 6pp.

TW Decision to Reject issued Jun. 28, 2024 in TW Application No. 112113572, 9 pages.

IN Office Action issued Jan. 29, 2026, in IN Application No. 202314029526, 7 pages.

\* cited by examiner

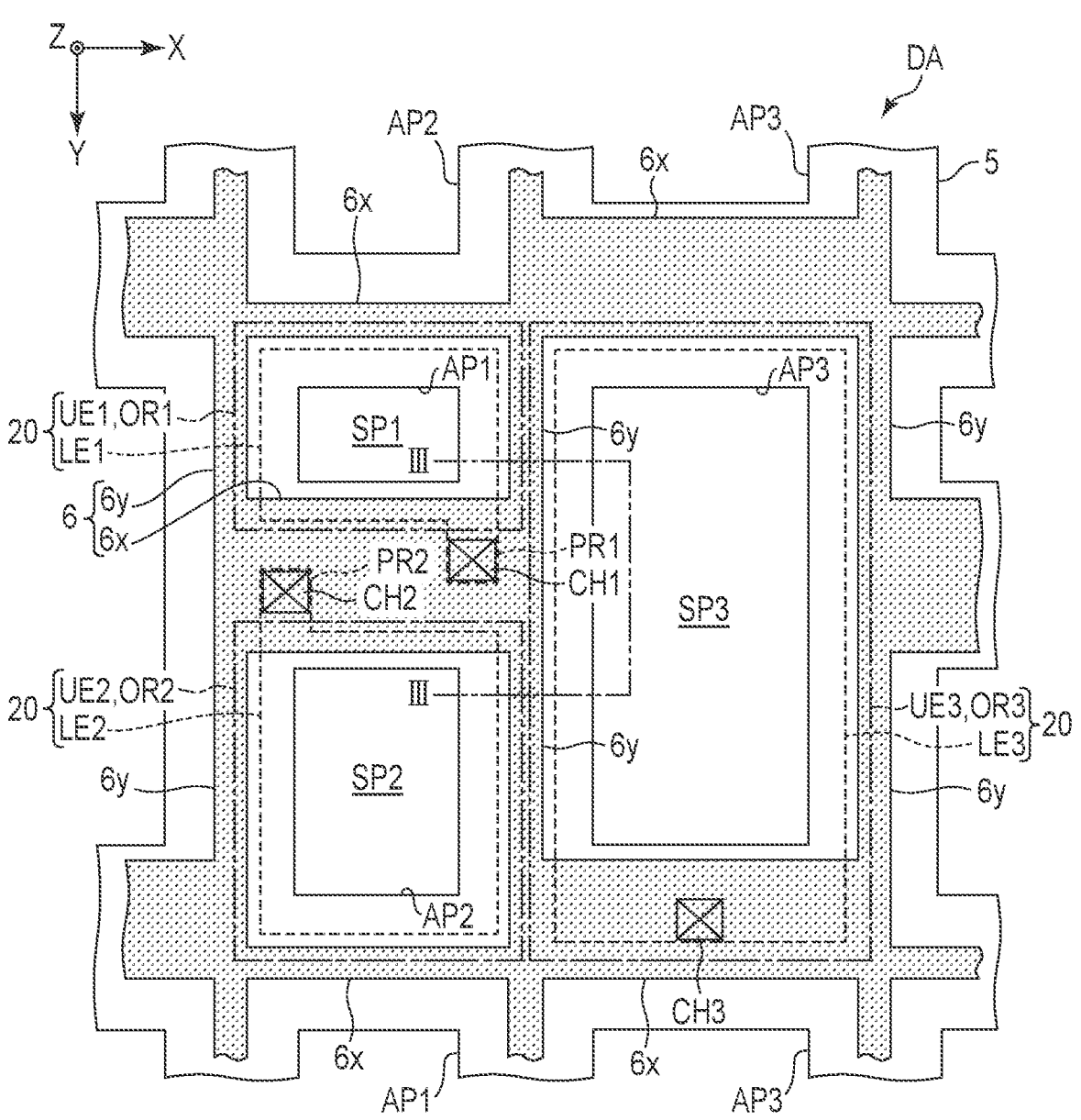
F I G. 2

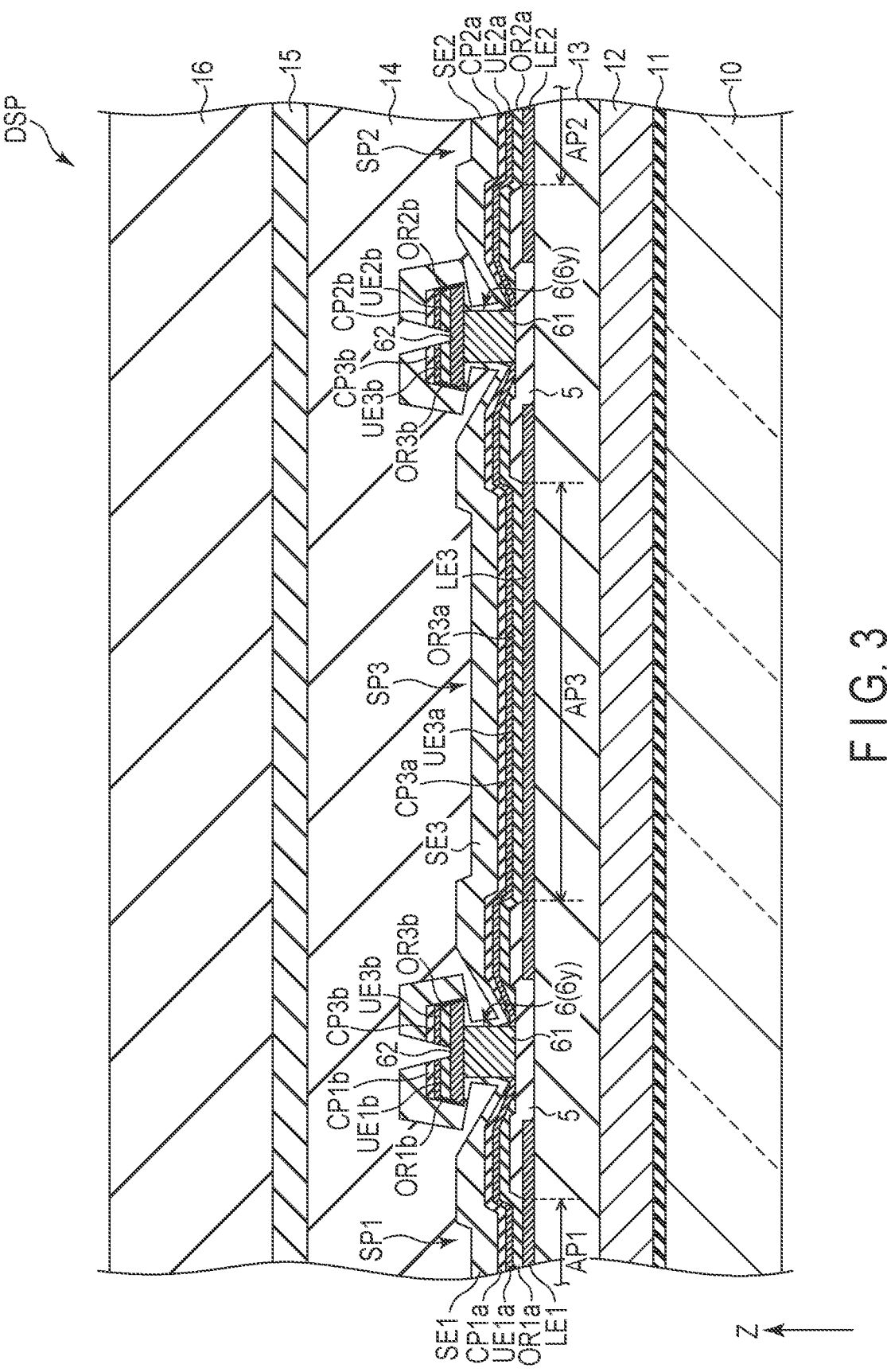
F I G. 3

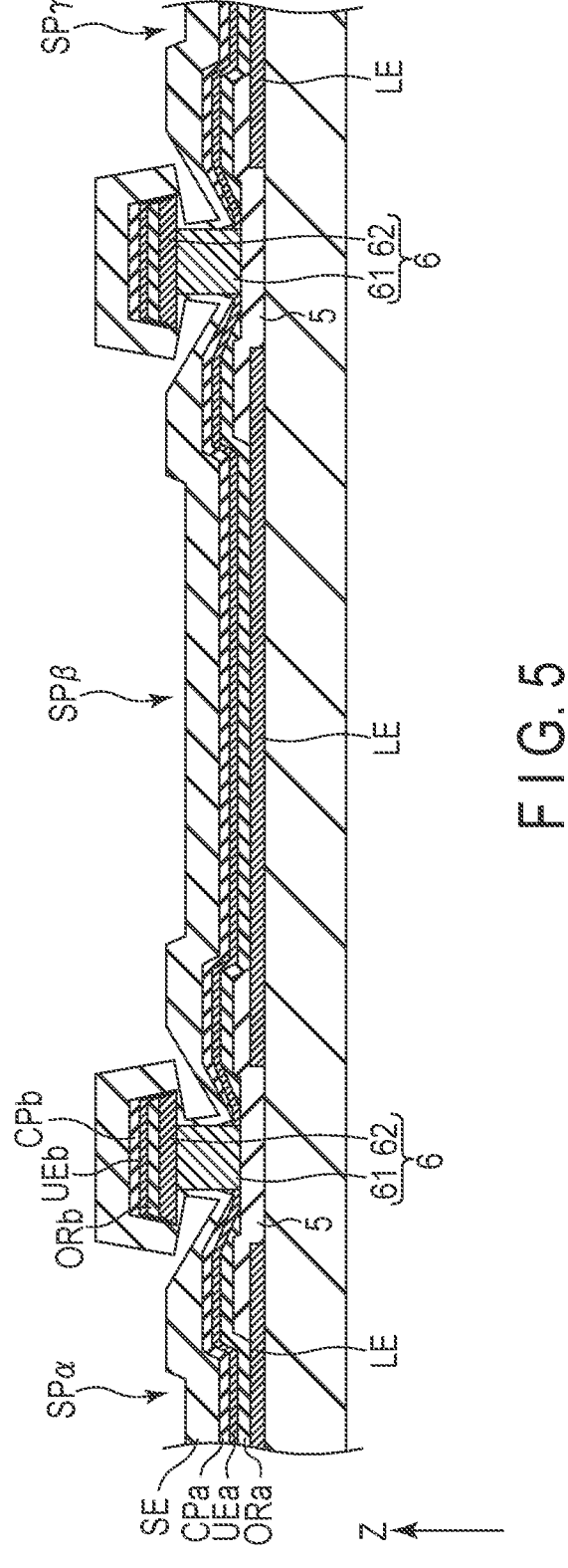
F I G. 5

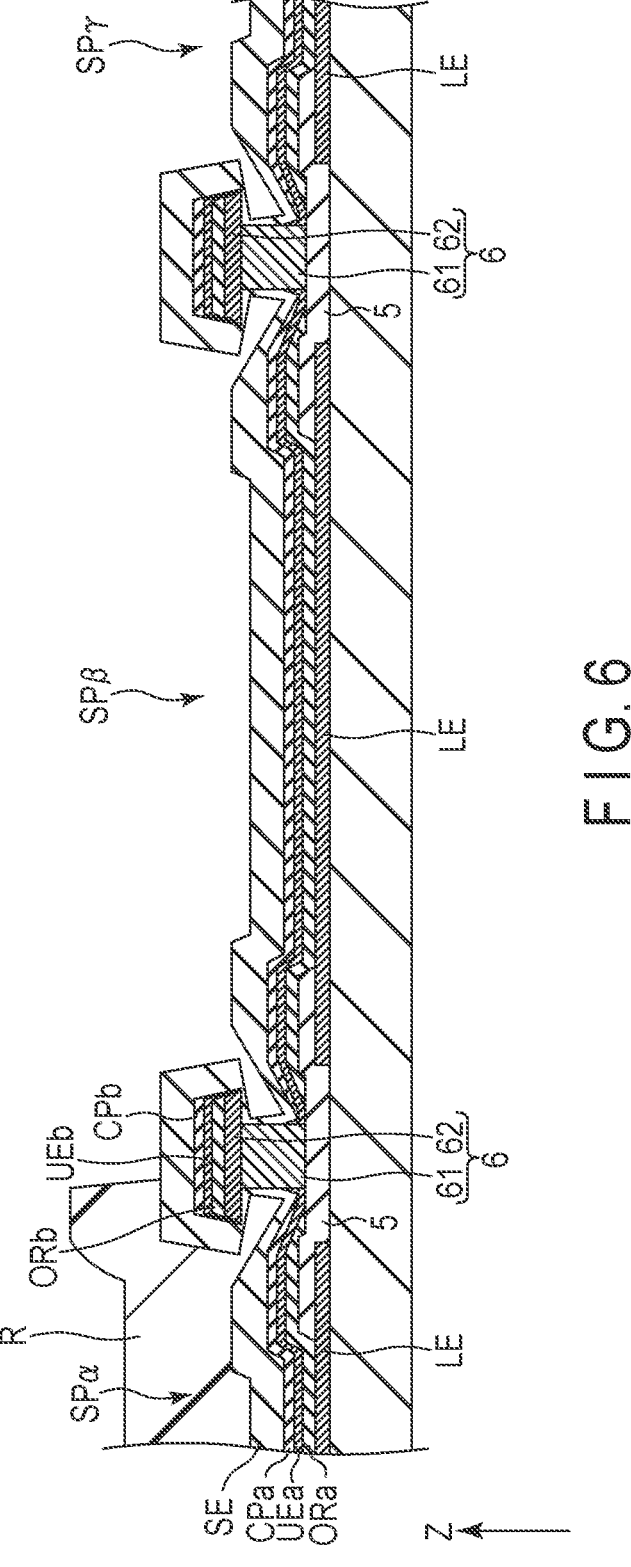
F I G. 6

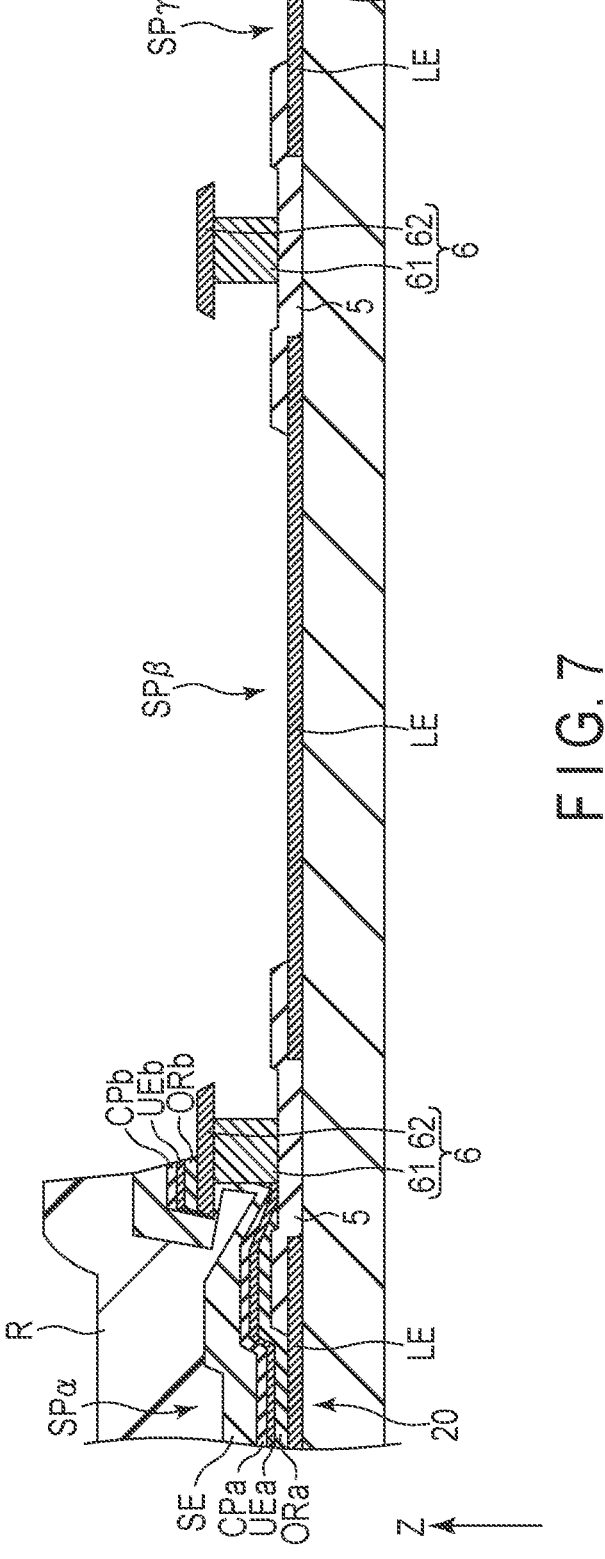
F I G. 7

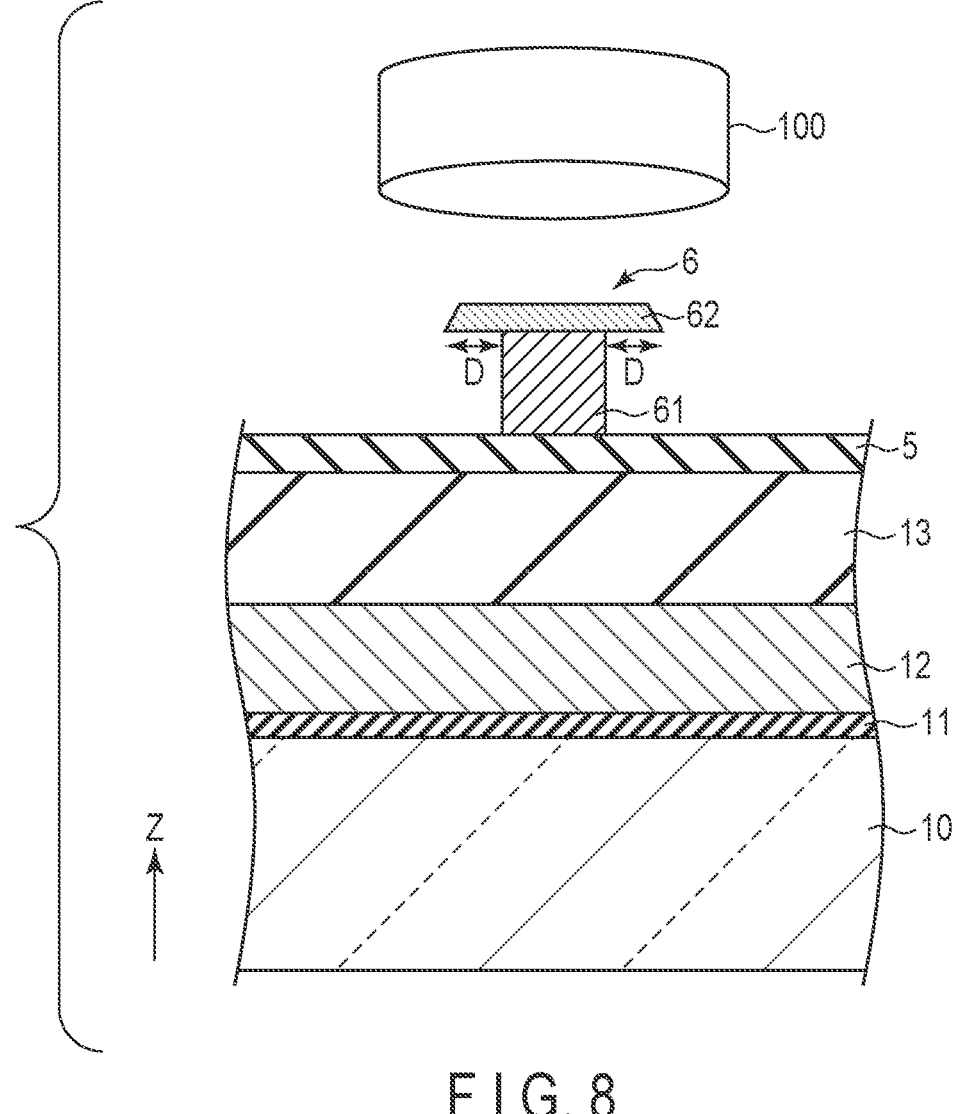
F I G. 8

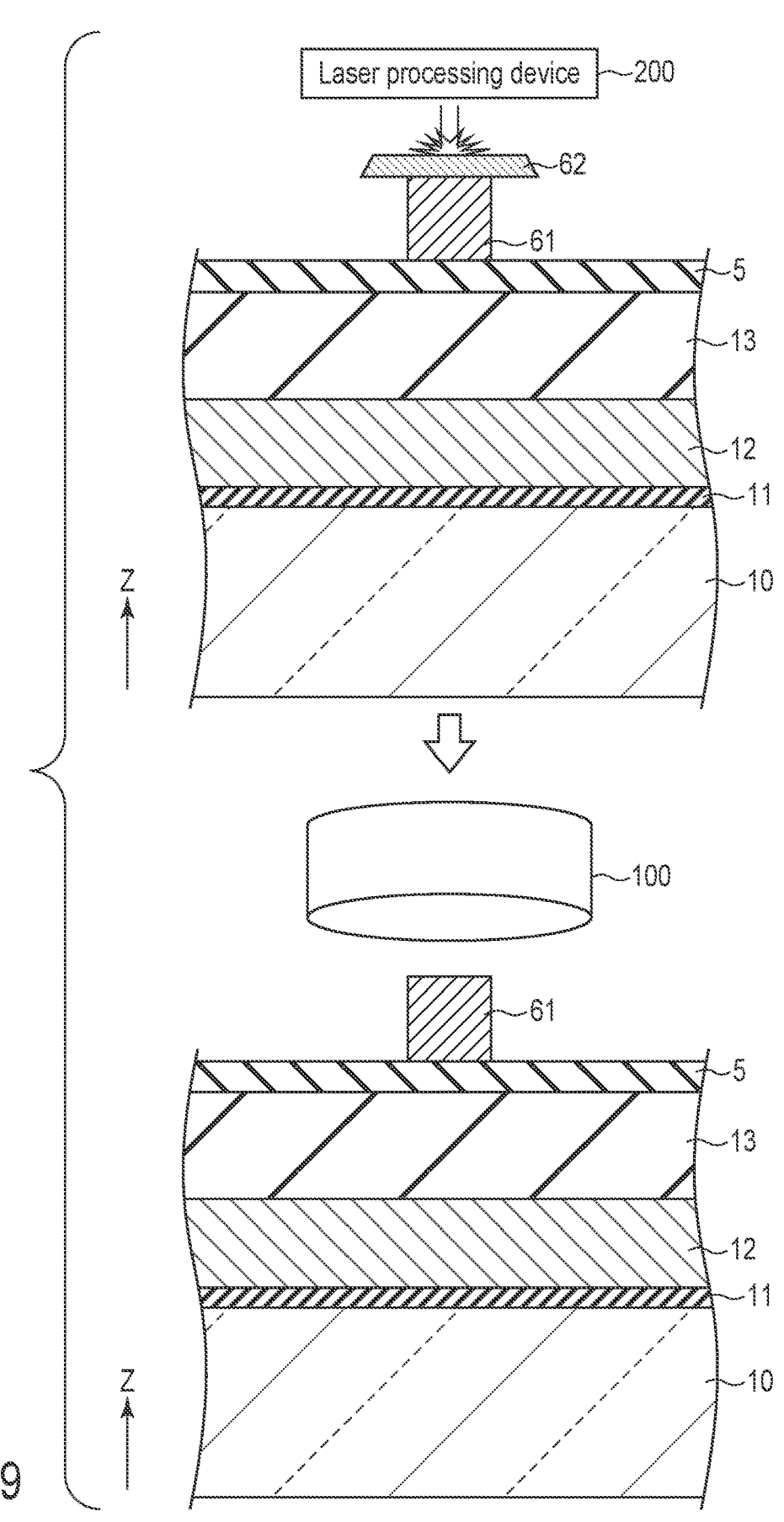
F I G. 9

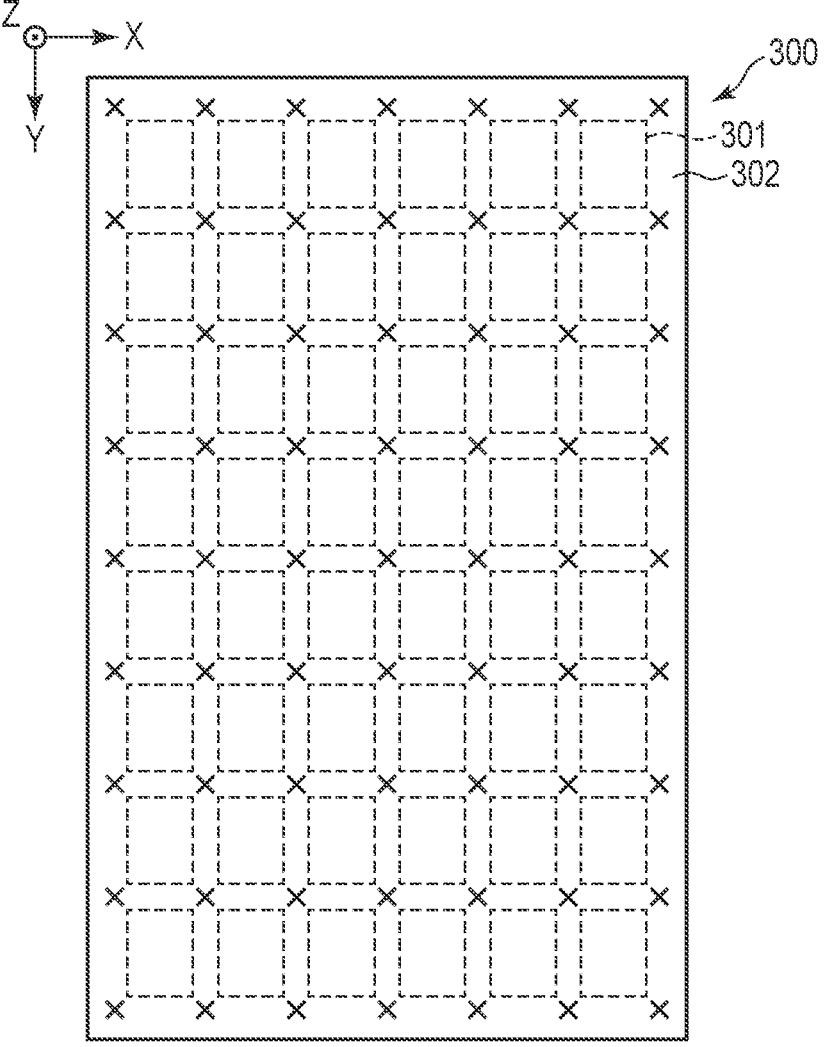
F I G. 10

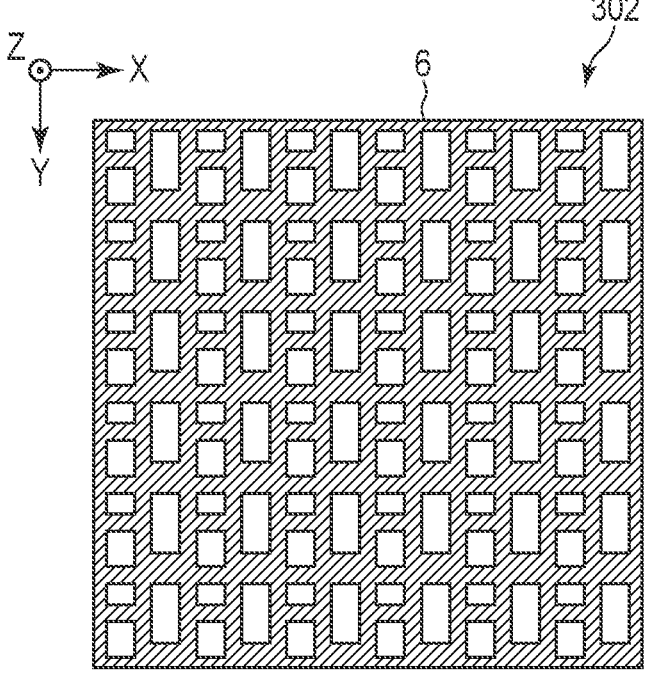
F I G. 12

METHOD OF MANUFACTURING DISPLAY DEVICE AND MOTHER SUBSTRATE

CROSS-REFERENCE TO RELATED APPLICATIONS

This application is based upon and claims the benefit of priority from Japanese Patent Application No. 2022-074874, filed Apr. 28, 2022, the entire contents of which are incorporated herein by reference.

FIELD

Embodiments described herein relate generally to a method for manufacturing a display device and a mother substrate.

BACKGROUND

In recent years, a display device in which an organic light-emitting diode (OLED) is applied as a display element has been put to practical use.

Here, the above-mentioned display device is manufactured by the following manner. That is, a mother base is prepared by forming a plurality of base all together at once, and a plurality of display panels are formed on the mother base, thus preparing a mother substrate. Then, display panels are cut from the mother substrate, and each of which is used for manufacturing the display device.

In the process of manufacturing such a display device, such a technology is required to suppress the degradation of reliability of the display device.

BRIEF DESCRIPTION OF THE DRAWINGS

FIG. 2 is a diagram showing an example of layout of subpixels.

FIG. 3 is a cross-sectional view schematically showing the display device, taken along line III-III in FIG. 2.

FIG. 5 is a cross-sectional view schematically illustrating a display element formed by using a partition.

FIG. 6 is a cross-sectional view schematically illustrating a display element formed by using a partition.

FIG. 7 is a cross-sectional view schematically illustrating a display element formed by using a partition.

FIG. 8 is a diagram for illustrating measurement of a protrusion amount of a partition.

FIG. 9 is a diagram for illustrating measurement of the protrusion amount of a partition.

FIG. 10 is a diagram schematically showing a mother substrate.

FIG. 12 is a diagram showing an example of a pattern of partitions formed in a surrounding area.

DETAILED DESCRIPTION

Figure 1:
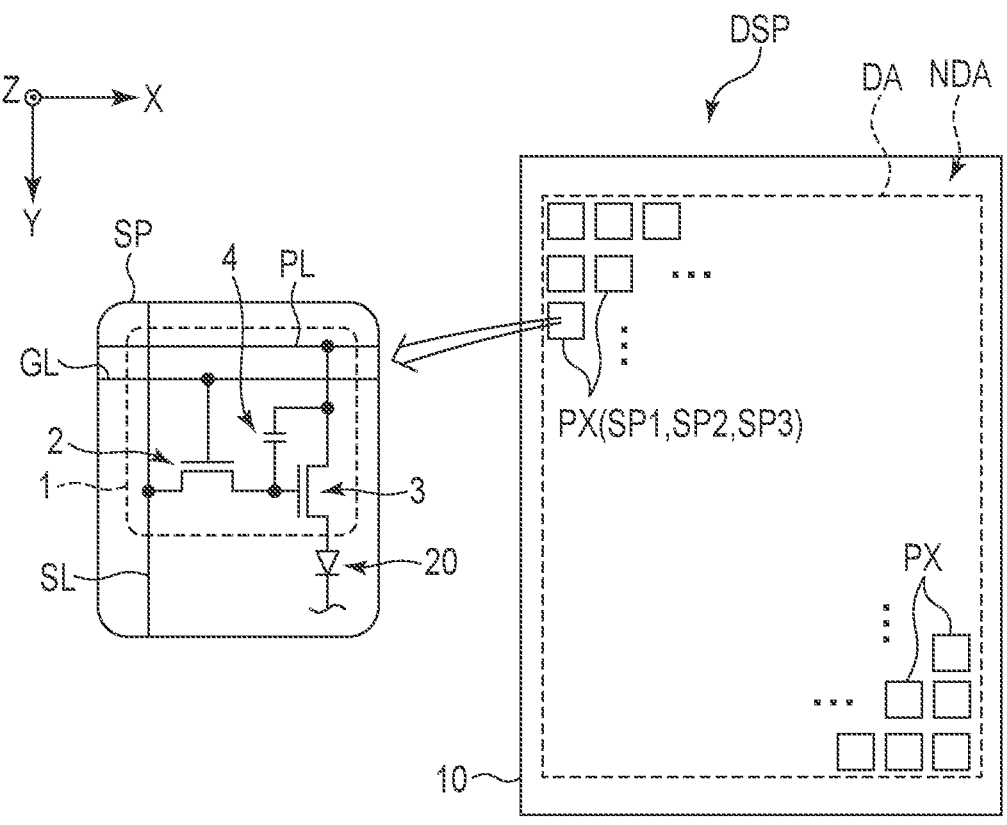
FIG. 1 is a diagram showing a configuration example of a display device according to an embodiment.

In general, according to one embodiment, a method of manufacturing a display device, includes forming a lower electrode on a base, forming a rib which covers a part of the lower electrode, forming a partition including a lower portion disposed on the rib and an upper portion protruding from a side surface of the lower portion, removing the upper portion of at least a part of the partition, measuring a first width of the lower portion of the partition and a second width of the upper portion of the partition and measuring a distance between the side surface of the lower portion and an end portion of the upper portion based on the first and second widths.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as a first direction, a direction along the Y axis is referred to as a second direction and a direction along the Z axis is referred to as a third direction. Further, viewing the elements parallel to the third direction Z is referred to as plan view.

The display device in this embodiment is an organic electroluminescent display device including an organic light-emitting diode (OLED) as a display element, and can be mounted on televisions, personal computers, in-vehicle devices, tablet terminals, smartphones, mobile cell phone terminal and the like.

FIG. 1 shows a configuration example of the display device DSP in this embodiment. The display device DSP includes a display area DA which displays images and a non-display area NDA surrounding the display area DA on an insulating base 10. The base 10 may be glass or a flexible resin film.

In this embodiment, the shape of the base 10 in plan view is rectangular. Note here that the shape of the base 10 in plan view is not limited to a rectangle, but may be other shapes such as a square, circle or oval.

The display area DA includes a plurality of pixels PX arranged in a matrix along the first direction X and the second direction Y. The pixels PX each include a plurality of subpixels SP. For example, the pixels PX each include a red subpixel SP1, a green subpixel SP2 and a blue subpixel SP3. Note that the pixels PX may each include, in addition to the subpixels SP1, SP2 and SP3, a subpixel SP of some other color such as white. Or, the pixels PX may each include subpixels SP of other colors in place of any of the subpixels SP1, SP2 and SP3.

The subpixels SP each includes a pixel circuit 1 and a display element 20 driven by the pixel circuit 1. The pixel circuit 1 includes a pixel switch 2, a drive transistor 3 and a capacitor 4. The pixel switch 2 and the drive transistor 3 are switching elements constituted by thin-film transistors, for example.

A gate electrode of the pixel switch 2 is connected to a scanning line GL. One of source and drain electrodes of the pixel switch 2 is connected to a signal line SL, and the other is connected to a gate electrode of the drive transistor 3 and the capacitor 4. In the drive transistor 3, one of source and drain electrodes is connected to a power line PL and capacitor 4, and the other is connected to the display element 20.

The configuration of the pixel circuit 1 is not limited to that of the example shown in FIG. 1. For example, the pixel circuit 1 may include more thin-film transistors and capacitors.

The display element 20 is an organic light-emitting diode (OLED) as a light emitting element. For example, the subpixel SP1 contains a display element 20 which emits light in a wavelength range of a red color, the subpixel SP2 contains a display element 20 which emits light in a wavelength range of a green color, and the subpixel SP3 contains a display element 20 which emits light in a wavelength range of a blue color.

FIG. 1 mainly shows a display panel used for manufacturing a display device DSP, and the display device DSP has a structure in which a circuit board, etc., including a driver (drive IC chip) to drive the display panel is connected to the display panel.

FIG. 2 shows an example of layout of subpixels SP1, SP2 and SP3. In the example illustrated in FIG. 2, the subpixels SP1 and SP2 are aligned along the second direction Y. Further, the subpixels SP1 and SP2 are each aligned with subpixel SP3 along the first direction X.

When the subpixels SP1, SP2 and SP3 are arranged in such a layout as shown in FIG. 2, rows in each of which the subpixels SP1 and SP2 are arranged alternately along the second direction Y and rows in each of which a plurality of subpixels SP3 are arranged repeatedly along the second direction Y are formed in the display area DA. These rows are alternately arranged along the first direction X.

The layout of the subpixels SP1, SP2 and SP3 is not limited to that of the example shown in FIG. 2. As another example, the subpixels SP1, SP2 and SP3 in each pixel PX may be arranged in order along the first direction X.

In the display area DA, a Rib 5 and a partition 6 are disposed. The rib 5 includes apertures AP1, AP2 and AP3 in the subpixels SP1, SP2 and SP3, respectively. In the example illustrated in FIG. 2, the apertures AP2 are larger in size than the apertures AP1, and the apertures AP3 are larger than the aperture AP2. The partition 6 is disposed at the boundaries of each adjacent pair of the subpixels SP and overlaps the rib 5 in plan view.

The partition 6 includes a plurality of first partitions 6x extending along the first direction X and a plurality of second partitions 6y extending along the second direction Y. The first partitions 6x are each disposed between each respective pair of apertures AP1 and AP2 adjacent to each other along the second direction Y and between each respective pair of apertures AP3 adjacent to each other along the second direction Y. The second partitions 6y are each disposed between each respective pair of apertures AP1 and AP3 adjacent to each other along the first direction X and between each respective pair of apertures AP2 and AP3 adjacent to each other along the first direction X.

In the example illustrated in FIG. 2, the first partitions 6x and the second partitions 6y are connected to each other. With this structure, the partition 6 as a whole is formed into a lattice shape which surrounds the apertures AP1, AP2 and AP3. The partition 6 may as well include apertures in the subpixels SP1, SP2 and SP3, respectively, as in the case of the rib 5.

That is, in this embodiment, the rib 5 and the partition 6 are arranged to compartmentalize the subpixels SP1, SP2 and SP3 one from another.

The subpixels SP1 each includes a lower electrode LE1, an upper electrode UE1 and an organic layer OR1, each of which overlap the respective aperture AP1. The subpixel SP2 each includes a lower electrode LE2, an upper electrode UE2 and an organic layer OR2, each of which overlap the respective apertures AP2. The subpixels SP3 each includes a lower electrode LE3, an upper electrode UE3 and an organic layer OR3, each of which overlap the respective aperture AP3. In the example illustrated in FIG. 2, the outlines of the upper electrode UE1 and the organic layer OR1 match each other, the outlines of the upper electrode UE2 and the organic layer OR2 match each other, and the outlines of the upper electrode UE3 and the organic layer OR3 match each other.

The lower electrode LE1, the upper electrode UE1 and the organic layer OR1 constitute the display element 20 of the subpixel SP1. The lower electrode LE2, the upper electrode UE2 and the organic layer OR2 constitute the display element 20 of the subpixel SP2. The lower electrode LE3, the upper electrode UE3 and the organic layer OR3 constitute the display element 20 of the subpixel SP3.

The lower electrode LE1 is connected to the pixel circuit 1 that drives the subpixel SP1 (the display element 20 thereof) via a contact hole CH1. The lower electrode LE2 is connected to the pixel circuit 1 that drives the subpixel SP2 (the display element 20 thereof) via a contact hole CH2. The lower electrode LE3 is connected to the pixel circuit 1 that drives the subpixel SP3 (the display element 20 thereof) via a contact hole CH3.

In the example illustrated in FIG. 2, the contact holes CH1 and CH2 entirely overlap the first partition 6x located between the apertures AP1 and AP2 adjacent to each other along the second direction Y. The contact hole CH3 entirely overlaps the first partition 6x located between two apertures AP3 adjacent to each other along the second direction Y. As another example, at least a part of the contact holes CH1, CH2 and CH3 may not overlap the first partition 6x.

In the example illustrated in FIG. 2, the lower electrodes LE1 and LE2 includes protrusions PR1 and PR2, respectively. The protrusion PR1 protrudes from the body of the lower electrode LE1(, which is a part overlapping the aperture AP1) toward the contact hole CH1. The protrusion PR2 protrudes from the body of the lower electrode LE2(, which is a part overlapping the aperture AP2) toward the contact hole CH2. The contact holes CH1 and CH2 overlap the protrusions PR1 and PR2, respectively.

FIG. 3 is a schematic cross-sectional view of the display device DSP taken along line III-III in FIG. 2. In the display device DSP, an insulating layer 11, referred to as an undercoat layer, is disposed on the base 10 (on a surface on a side where the display element 20 and the like are disposed).

The insulating layer 11 has a three-layer stacked structure including, for example, a silicon oxide film (SiO), a silicon nitride film (SiN) and a silicon oxide film (SiO). Note that the insulating layer 11 is not limited to a three-layer stacked structure, but may have a stacked structure of three or more layers, or may have a single-layer structure or a two-layer stacked structure.

On the insulating layer 11, a circuit layer 12 is disposed. The circuit layer 12 includes various types of circuits and wiring lines that drive the subpixels SP (SP1, SP2 and SP3)

such as the pixel circuit 1, scanning line GL, signal line SL and power line PL shown in FIG. 1. The circuit layer 12 is covered by an insulating layer 13.

The insulating layer 13 functions as a planarization film that planarizes the unevenness caused by the circuit layer 12. Although not shown in FIG. 3, the contact holes CH1, CH2 and CH3 described above are provided in the insulating layer 13.

The lower electrodes LE (LE1, LE2 and LE3) are disposed on the insulating layer 13. The rib 5 is disposed over the insulating layer 13 and the lower electrode LE. An end portion (a part) of the lower electrode LE is covered by the rib 5.

The partition 6 includes a lower portion 61 disposed on the rib 5 and an upper portion 62 covering an upper surface of the lower portion 61. The upper portion 62 has a width greater than that of the lower portion 61 along the first direction X as well as the second direction Y. With this configuration, the partition 6 has such a shape that both ends of the upper portion 62 protrude beyond side surfaces of the lower portion 61. Such a shape of the partition 6 may as well be referred to as an overhang shape.

The organic layers OR (OR1, OR2 and OR3) and the upper electrodes UE (UE1, UE2 and UE3) constitute the display elements 20, respectively, together with the lower electrodes LE (LE1, LE2 and LE3) described above. Here, as shown in FIG. 3, the organic layer OR1 includes a first organic layer OR1*a* and a second organic layer OR1*b* spaced apart from each other. The upper electrode UE1 includes a first upper electrode UE1*a* and a second upper electrode UE1*b* spaced apart from each other. The first organic layer OR1*a* is in contact with the lower electrode LE1 via the aperture AP1, and covers a part of the rib 5 as well. The second organic layer OR1*b* is located on the upper portion 62. The first upper electrode UE1*a* opposes the lower electrode LE1 and covers the first organic layer OR1*a*. Further, the first upper electrode UE1*a* is in contact with a side surface of the lower portion 61. The second upper electrode UE1*b* is located above the partition 6 and covers the second organic layer OR1*b*.

Moreover, as shown in FIG. 3, the organic layer OR2 includes a first organic layer OR2*a* and a second organic layer OR2*b* spaced apart from each other. The upper electrode UE2 includes a first upper electrode UE2*a* and a second upper electrode UE2*b* spaced apart from each other. The first organic layer OR2*a* is in contact with the lower electrode LE2 via the aperture AP2 and covers a part of the rib 5. The second organic layer OR2*b* is located on the upper portion 62. The first upper electrode UE2*a* opposed the lower electrode LE2 and covers the first organic layer OR2*a*. Further, the first upper electrode UE2*a* is in contact with the side surface of the lower portion 61. The second upper electrode UE2*b* is located above the partition 6 and covers the second organic layer OR2*b*.

As shown in FIG. 3, the organic layer OR3 includes a first organic layer OR3*a* and a second organic layer OR3*b* spaced apart from each other. The upper electrode UE3 includes a first upper electrode UE3*a* and a second upper electrode UE3*b* spaced apart from each other. The first organic layer OR3*a* is in contact with the lower electrode LE3 via the aperture AP3 and covers a part of the rib 5. The second organic layer OR3*b* is located on the upper portion 62. The first upper electrode UE3*a* opposes the lower electrode LE3 and covers the first organic layer OR3*a*. Further, the first upper electrode UE3*a* is in contact with a side surface of the lower portion 61. The second upper electrode UE3*b* is located above the partition 6 and covers the second organic layer OR3*b*.

In the example illustrated in FIG. 3, the subpixels SP1, SP2 and SP3 include cap layers CP1, CP2 and CP3, respectively, for adjusting the optical properties of the light emitted by the light-emitting layers of the organic layers OR1, OR2 and OR3.

The cap layer CP1 includes a first cap layer CP1*a* and a second cap layer CP1*b* spaced apart from each other. The first cap layer CP1*a* is located in the aperture AP1 and disposed on the first upper electrode UE1*a*. The second cap layer CP1*b* is located above the partition 6 and disposed on the second upper electrode UE1*b*.

The cap layer CP2 includes a first cap layer CP2*a* and a second cap layer CP2*b* spaced apart from each other. The first cap layer CP2*a* is located in the aperture AP2 and disposed on the first upper electrode UE2*a*. The second cap layer CP2*b* is located above the partition 6 and disposed on the second upper electrode UE2*b*.

The cap layer CP3 includes a first cap layer CP3*a* and a second cap layer CP3*b* spaced apart from each other. The first cap layer CP3*a* is located in the aperture AP3 and disposed on the first upper electrode UE3*a*. The second cap layer CP3*b* is located above the partition 6 and disposed on the second upper electrode UE3*b*.

On the on subpixels SP1, SP2 and SP3, sealing layers SE1, SE2 and SE3 are disposed respectively. The sealing layer SE1 continuously covers members of the subpixel SP1, which include the first cap layer CP1*a*, the partition 6 and the second cap layer CP1*b*. The sealing layer SE2 continuously covers members of the subpixel SP2, which include the first cap layer CP2*a*, the partition 6 and the second cap layer CP2*b*. The sealing layer SE3 continuously covers members of the subpixel SP3, which include the first cap layer CP3*a*, the partition 6 and the second cap layer CP3*b*.

In the example illustrated in FIG. 3, the second organic layer OR1*b*, the second upper electrode UE1*b*, the second cap layer CP1*b* and the sealing layer SE1 on the partition 6 between the subpixels SP1 and SP3 are separated from the second organic layer OR3*b*, the second upper electrode UE3*b*, the second cap layer CP3*b* and the sealing layer SE3 on the partition 6. Further, the second organic layer OR2*b*, the second upper electrode UE2*b*, the second cap layer CP2*b* and the sealing layer SE2 on the partition 6 between the subpixels SP2 and SP3 are separated from the second organic layer OR3*b*, the second upper electrode UE3*b*, the second cap layer CP3*b* and the sealing layer SE3 on the partition 6.

The sealing layers SE1, SE2 and SE3 are covered by a resin layer 14. The resin layer 14 is covered by a sealing layer 15. Further, the sealing layer 15 is covered by a resin layer 16.

The insulating layer 13 and the resin layers 14 and 16 are formed of organic materials. The rib 5 and the sealing layer 15 and SE (SE1, SE2 and SE3) are formed of, for example, inorganic materials including silicon nitride (SiNx).

The lower portion 61 of the partition 6 has conductivity. The upper portion 62 of the partition 6 may as well be formed conductive. The lower electrode LE may be formed of a transparent conductive oxide such as indium tin oxide (ITO) or may have a multilayer stacked structure of a metal material such as silver (Ag) and a conductive oxide. The upper electrode UE is formed of a metal material such as an alloy of magnesium and silver (MgAg), for example. The upper electrode UE may as well be formed of a conductive oxide such as ITO.

When the potential of the lower electrode LE is relatively higher than that of the upper electrode UE, the lower electrode LE corresponds to an anode and the upper electrode UE corresponds to a cathode. Or, when the potential of the upper electrode UE is relatively higher than that of the lower electrode LE, the upper electrode UE corresponds to an anode and the lower electrode LE corresponds to a cathode.

The organic layer OR includes a pair of functional layers and a light-emitting layer disposed between these functional layers. For example, the organic layer OR has a structure in which a hole injection layer, a hole transport layer, an electron blocking layer, an emitting layer, a hole blocking layer, an electron transport layer and an electron injection layer are stacked one on another in order.

The cap layers CP (CP1, CP2 and CP3) are each formed, for example, from a multilayer body of a plurality of transparent thin films. The multilayer body may include, as the thin films, thin films formed of inorganic materials and thin films formed of organic materials. These thin films have refractive indices different from each other. The material of the thin films which constitute the multilayer body is different from the material of the upper electrode UE and also from the material of the sealing layers SE. Note here that the cap layers CP may be omitted.

To the partition 6, a common voltage is supplied. The common voltage is supplied to each of the upper electrodes UE (the first upper electrodes UE1a, UE2a and UE3a), which are in contact with the side surface of the lower portion 61. To the lower electrodes LE (LE1, LE2 and LE3), pixel voltages are supplied via the pixel circuits 1 of the subpixels SP (SP1, SP2 and SP3), respectively.

When a potential difference is created between the lower electrode LE1 and the upper electrode UE1, the light-emitting layer of the first organic layer OR1a emits light in a wavelength range of a red color. When a potential difference is created between the lower electrode LE2 and the upper electrode UE2, the light-emitting layer of the first organic layer OR2a emits light in a wavelength range of a green color. When a potential difference is created between the lower electrode LE3 and the upper electrode UE3, the light-emitting layer of the first organic layer OR3a emits light in a wavelength range of a blue color.

As another example, the light-emitting layers of the organic layers OR1, OR2 and OR3 may emit light of the same color (for example, white). In this case, the display device DSP may include color filters that convert the light emitted by the light-emitting layers into light of colors corresponding to the subpixels SP1, SP2 and SP3, respectively. Further, the display device DSP may include layers containing quantum dots that are excited by the light emitted by the light-emitting layers to generate light of colors corresponding to the subpixels SP1, SP2 and SP3, respectively.

Figure 4:
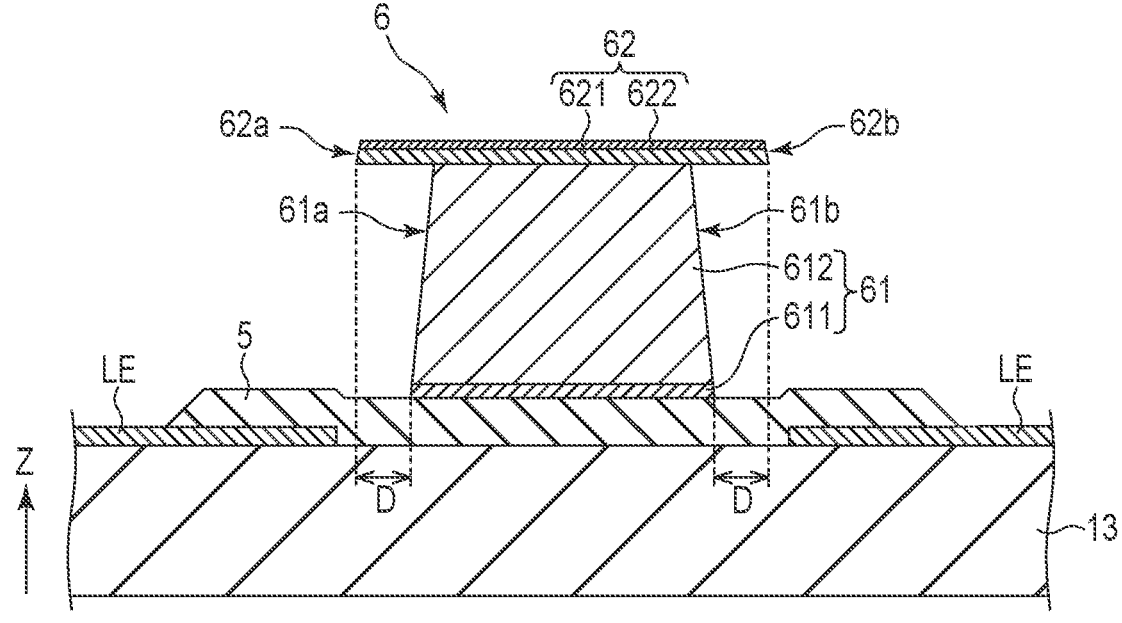
FIG. 4 is a cross-sectional view schematically showing a partition.

FIG. 4 is an enlarged cross-sectional view schematically showing the partition 6. In FIG. 4, elements other than the rib 5, the partition 6, the insulating layer 13 and the pair of lower electrodes LE are omitted from illustration. The pair of lower electrodes LE correspond to any of the lower electrodes LE1, LE2 and LE3 described above. The first partitions 6x and the second partitions 6y described above have the same structure as that of the partition 6 shown in FIG. 4.

In the example illustrated in FIG. 4, the lower portion 61 of the partition 6 includes a barrier layer 611 disposed on the rib 5 and a metal layer 612 disposed on the barrier layer 611. The barrier layer 611 is formed of a material different from that of the metal layer 612, that is, for example, a metal material such as molybdenum. The metal layer 612 is formed thicker than the barrier layer 611. The metal layer 612 may be of a single-layer structure or a stacked structure of different metallic materials. For example, the metal layer 612 is formed, for example, by aluminum (Al).

The upper portion 62 is thinner than the lower portion 61. In the example illustrated in FIG. 4, the upper portion 62 includes a first layer 621 disposed on the metal layer 612 and a second layer 622 disposed on the first layer 621. For example, the first layer 621 is formed of titanium (Ti), whereas the second layer 622 is formed of ITO, for example. Note that the upper layer 62 is described here as having a two-layer stacked structure, but the upper layer 62 may be of a single-layer structure formed of, for example, a metal material such as titanium. Further, the upper layer 62 may as well be of other than a metal material, and may be an inorganic material such as silicon oxide (SiO). Furthermore, the upper layer 62 may be formed by stacking a conductive oxide such as ITO mentioned above, a metal material such as titanium and an inorganic material such as silicon oxide as appropriate in combination, or it may be a single layer made of any one of the above-listed materials.

In the example illustrated in FIG. 4, the width of the lower portion 61 decreases as the location is closer to the upper portion 62. In other words, side surfaces 61a and 61b of the lower portion 61 are inclined with respect to the third direction Z. Note here that the upper portion 62 includes an end portion 62a protruding from the side surface 61a and an end portion 62b protruding from the side surface 61b.

Here, the amount of protrusion of the end portions 62a and 62b from the side surfaces 61a and 61b is represented by D(, which will be referred to as the protrusion amount D of the partition 6, hereinafter) and is, for example, 2.0 μm or less. The protrusion amount D of the partition 6 in this embodiment corresponds to the distance between a respective lower edge of the side surface 61a (the barrier layer 611) and the end portion 62a and between a respective lower edge of the side surface 61b (the barrier layer 611) and the end portion 62 along the width direction of the partition 6 (the first direction X or second direction Y), which is orthogonal to the third direction Z.

The configuration of the partition 6 and the material of each member of the partition 6 may be selected as appropriate in consideration of, for example, the method of forming the partition 6 and the like.

In this embodiment, the partition 6 is formed to compartmentalize the subpixels SP in plan view. Here, the organic layer OR described above is formed, for example, by an anisotropic or directional vacuum deposition method. When the organic material for forming the organic layer OR is deposited over the entire base 10 with the partition 6 disposed therein, the organic layer OR is not substantially formed on the side surface of the partition 6 because the partition 6 has such a shape as shown in FIGS. 3 and 4. In this manner, the organic layer OR (the display elements 20) can be formed such as to be divided into each subpixel SP by the partition 6.

FIGS. 5 to 7 are each a schematic cross-sectional view to illustrate display elements 20 formed by using the partition 6. FIGS. 5 to 7 show subpixels SPα, SPβ and SPγ, which correspond to any of the subpixels SP1, SP2 and SP3.

With the partition 6 disposed as described above, the organic layer OR, the upper electrode UE, the cap layer CP and the sealing layer SE are formed by vapor deposition in order on the entire base 10 as shown in FIG. 5. The organic layer OR includes a light-emitting layer that emits light of a color corresponding to the subpixel SPα. With the overhanging partition 6, the organic layer OR is divided into a first organic layer ORa covering the lower electrode LE and a second organic layer ORb on the partition 6, the upper electrode UE is divided into a first upper electrode UEa covering the first organic layer ORa and a second upper electrode UEb covering the second organic layer ORb, and the cap layer CP is divided into a first cap layer CPa covering the first upper electrode UEa and a second cap layer CPb covering the second upper electrode UEb. The first upper electrode UEa is in contact with the lower portion 61 of the partition 6. The sealing layer SE continuously covers the first cap layer CPa, the second cap layer CPb and the partition 6.

Next, as shown in FIG. 6, a resist R is formed on the sealing layer SE. The resist R covers the subpixel SPα. In other words, the resist R is disposed directly above the first organic layer ORa, the first upper electrode UEa and the first cap layer CPa, which are located in the subpixel SPα. The resist R is also located directly above the portion of the second organic layer ORb, the second upper electrode UEb and the second cap layer CPb on the partition 6 between the subpixel SPα and the subpixel SPβ, which is closer to the subpixel SPα. In other words, at least a part of the partition 6 is exposed from the resist R.

Further, by etching using the resist R as a mask, portions of the organic layer OR, the upper electrode UE, the cap layer CP and the sealing layer SE, which are exposed from the resist R are removed, as shown in FIG. 7. As a result, a display element 20 which includes the lower electrode LE, the first organic layer ORa, the first upper electrode UEa and the first cap layer CPa is formed in the subpixel SPα. On the other hand, in the subpixels SPβ and SPγ, the lower electrode LE is exposed. Note that the etching described above includes, for example, dry etching of the sealing layer SE, wet etching and dry etching of the cap layer CP, wet etching of the upper electrode UE, and dry etching of the organic layer OR.

After the display element 20 of the subpixel SPα is formed as described above, the resist R is removed and the display elements 20 of the subpixels SPβ and SPγ are formed in the same order as in the case of the subpixel SPα.

By exemplified above with respect to the subpixels SPα, SPβ and SPγ, the display elements 20 of the subpixels SP1, SP2 and SP3 are formed and further the resin layer 14, the sealing layer 15 and the resin layer 16 are formed, thereby realizing the configuration of the display device DSP shown in FIG. 3.

Here, as described above, the partition 6 includes the lower portion 61 and an upper portion 62 protruding from the side surfaces of the lower portion 61. If the protrusion amount D (eave width) of the partition 6 described above is not appropriate, the reliability of the display device DSP may be reduced.

More specifically, the display device DSP has such a structure that the organic layer OR is divided for each subpixel SP by the partition 6. With this structure, if the protrusion amount D of the partition 6 is not sufficiently larger than the designed value, the organic layer OR may not be divided appropriately. Further, if the side surface of the lower portion 61 of the partition 6 is covered by the organic layer OR, the electrical connection between the lower portion 61 and the upper electrode UE is impeded. On the other hand, in the display device DSP, the upper electrode UE is in contact with the side surface of the lower portion 61 of the partition 6. Here, if the protrusion amount D of the partition 6 exceeds the designed value, the upper electrode UE may not be brought into contact with the side surface of the lower portion 61.

In other words, if the protrusion amount D of the above-mentioned partition 6 is not appropriate, a highly reliable display device DSP cannot be manufactured. Therefore, it is useful to measure the protrusion amount D (that is, the distance between the side surface of the lower portion 61 and the end portion of the upper portion 62 of the partition 6) in the manufacturing process of the display device DSP. Note that for the measurement of the protrusion amount D of the partition 6, for example, a length-measuring machine camera can be used, which is configured to measure, by capturing an image including an object, the length of the object.

Here, as shown in FIG. 8, let us assume the case where the protrusion amount D of the partition 6 is measured by capturing the image of the partition 6 from the third direction Z (that is, from a side of the display surface of the display device DSP) using the length-measuring machine camera 100 at the stage where the partition 6 is formed. In this case, the upper portion 62 of the partition 6 has a width larger than that of the lower portion 61 (in other words, the partition 6 has the overhang shape). With this structure, for example, if the upper portion 62 contains a layer formed of a light-shielding metal material (for example, titanium) that has no light transparency, the side surface of the lower portion 61 (that is, the end portion of the lower portion 61 along the first direction X or the second direction Y) cannot be shot by the length-measuring machine camera 100. That is, in the example shown in FIG. 8, the length of the upper portion 62 along the first direction X or the second direction Y(, which will be referred to as the width of the upper portion 62 hereinafter) can be measured, but the protrusion amount D of the partition 6 cannot be measured.

Therefore, as shown in FIG. 9, in this embodiment, after removing (blowing off or melting away) the upper portion 62 of the partition 6 using a laser processing device 200 configured to process metal materials by irradiating laser, the length of the lower portion 61 along the first direction X or the second direction Y (hereinafter referred to as the width of the lower portion 61) is measured by shooting the image of the lower portion 61 of the partition 6 using a length-measuring machine camera 100. In this embodiment, the protrusion D of the partition 6 (that is, the distance between a side surface of the lower portion 61 and a respective end portion of the respective upper portion 62) is measured based on the width of the lower portion 61 thus measured and the width of the upper portion 62 described above.

Incidentally, generally, in the manufacturing process of a display device DSP, a mother substrate is manufactured, on which a plurality of display panels are formed on a mother base in which a plurality of bases 10 are formed at once. Then, each of the display panels cut from the mother substrate, and using this display panel, the display device DSP is thus manufactured.

FIG. 10 schematically shows a mother board (mother base). As shown in FIG. 10, a mother substrate 300 includes a plurality of panel regions 301 and a peripheral region 302. The size of the mother substrate 300 is about 1500 mm×950 mm, for example, but the size is not limited to this.

The panel regions 301 are each a region where a display panel is formed and are arranged in a matrix along the first direction X and the second direction Y. The peripheral region 302 is a region that is located around the panel regions 301 and compartmentalize the plurality of panel regions 301 from each other.

Here, the partitions 6 (the partitions 6 including the lower portions 61 and upper portions 62, respectively) disposed in the plurality of panel regions 301 are necessary for forming each subpixel SP in the process of forming the display panel used for manufacturing the display device DSP. Therefore, in order to measure the protrusion amount D of the partitions 6 as described above, the laser processing device 200 cannot be used to remove the upper portions 62 of the partitions 6 located in the plurality of panel regions 301.

For this reason, in this embodiment, the protrusion amount D of the partition 6 will be measured by utilizing the peripheral region 302 (that is, the region marked with "x" in FIG. 10, for example) as inspection of the mother substrate 300 described above. With this operation, even if the upper portion 62 is removed to measure the protrusion amount D of the partition 6, the display panel used for manufacturing the display device DSP can be properly formed.

Figure 11:
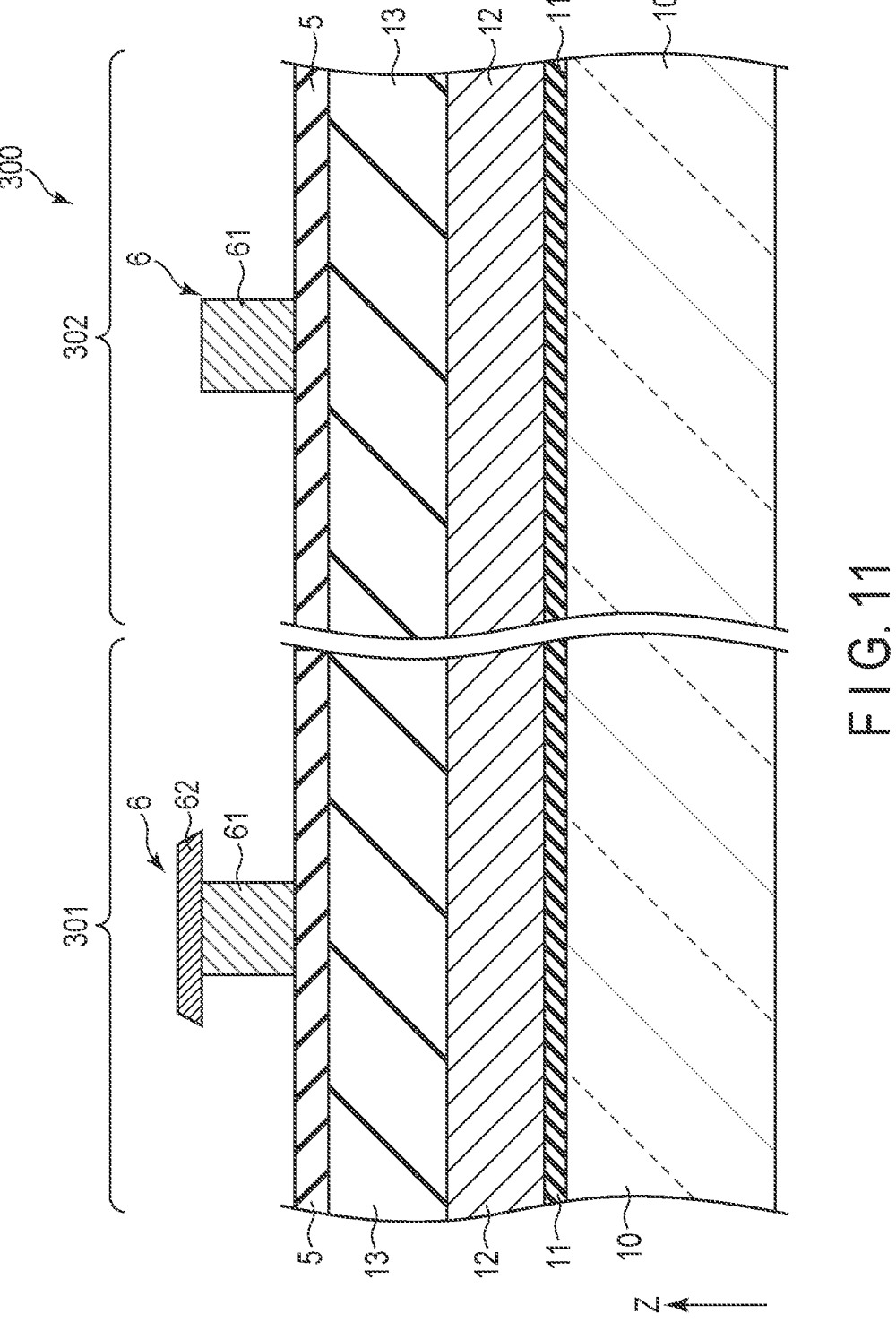
FIG. 11 is a diagram schematically showing a method of manufacturing a display device.

Now, a manufacturing method (manufacturing process) for the display device DSP according to this embodiment will be described with reference to FIG. 11.

First, a mother base (hereinafter referred to as "mother base 10" for convenience) is prepared, on which an insulating layer 11, a circuit layer 12, an insulating layer 13, a rib 5 and a partition 6 (lower portion 61 and upper portion 62) are formed in order on the mother base 10 in the panel regions 301 and the peripheral region 302.

The insulating layer 11, the circuit layer 12, the insulating layer 13, the rib 5 and the partition 6 are assumed to be formed by the same process in the panel regions 301 and the peripheral region 302.

When the partition 6 is formed as described above, the upper portion 62 of the partition 6 formed in the peripheral region 302 is removed using the laser processing device 200. As described above, the laser processing device 200 is configured to process metal materials by irradiating laser thereon, and (the amount of energy of the laser irradiated by) the laser processing device 200 is assumed to be adjusted in advance to remove the upper portion 62 of the partition 6. Note that it is preferable in this embodiment that only the upper portion 62 of the partition 6 should be removed by the laser processing device 200, but according to the viewpoint of measuring the protrusion amount D of the partition 6 as described above, the laser processing device 200 should be operated so as not to remove at least the barrier layer 611 shown in FIG. 4 (that is, the portion of the lower portion 61 portion of the partition 6, which is located directly above the rib 5).

With this operation, by shooting the image of the partition 6 whose upper portion 62 has been removed in the peripheral region 302 with the length measuring machine camera 100, the width of the lower portion 61 of the partition 6 can be measured.

In this embodiment, by calculating the difference between the width of the lower portion 61 measured as described above and the width of the upper portion 62 measured by shooting the image of the partition 6 whose upper portion 62 has not been removed, the protrusion D of the partition 6 (that is, the distance between the side surface of the lower portion 61 and the end portion of the upper portion 62) can be measured.

When the protrusion amount D of the partition 6 thus measured is appropriate, the display element 20 of each subpixel SP is formed as described in FIGS. 5 to 7 above. Thereafter, the display panels formed respectively in the panel regions 301 are cut from the mother substrate 300, and using a cut display panel, the display device DSP is manufactured.

Note here that the protrusion amount D of the partition 6 in this embodiment corresponds to one half of the difference between the width of the lower portion 61 and the width of the upper portion 62 measured using the length-measuring machine camera 100 as described above, but the protrusion amount D of the partition 6 may be automatically calculated by the length-measuring machine camera 100 or an electronic device connected to the length measuring machine camera 100. Or it may be calculated by a manager or the like involved in the manufacture of the display device DSP with reference to the width of the lower portion 61 and the width of the upper portion 62.

Whether or not the protrusion amount D of the partition 6 measured using the length-measuring machine camera 100 is appropriate can be determined, for example, by the manager mentioned above or the like. Note here that, in order to assist the manager in determining whether the protrusion amount D of the partition 6 is appropriate or not, the length-measuring machine camera 100 or an electronic device connected to the length-measuring machine camera 100 may as well be used, that outputs an alert when the measured protrusion amount D of the partition 6 does not fall within a predetermined range (that is, the protrusion amount D is not appropriate), for example.

The protrusion amount D of the partition 6 to be measured in this embodiment may be a distance (length) along the first direction X and the second direction Y, or a distance (length) along one of the first direction X and the second direction Y.

Further, although a detailed description thereof thereof will be omitted, the partition 6 in this embodiment is formed by, for example, carrying out isotropic wet etching after carrying out anisotropic dry etching on the lower portion 61 and the upper portion 62. Here, this embodiment has the structure of measuring the protrusion amount D of the partition 6 in order to suppress the degrading in reliability of the display device DSP (display panel). Therefore, if partitions 6 having different protrusion amounts D are formed respectively in the panel regions 301 and the peripheral region 302, the significance of measuring the protrusion amount D in the peripheral region 302 is reduced.

For this reason, in this embodiment, in order to equalize the variation in the etching amount during the formation of the partitions 6 in the panel regions 301 and the peripheral region 302 (that is, to equalize the protrusion amounts D of the partition 6 of the panel regions 301 and the protrusion amount of the partition 6 of the peripheral region 302), a partition 6 having a pattern identical to that of the partition 6 in the panel regions 301 is assumed to be formed in at least in the regions marked with "x" in the peripheral region 302. More specifically, in the panel regions 301, the partition 6 is formed in a pattern identical to that compartmentalizing the subpixels SP, and in the peripheral region 302, similarly, the partition 6 is supposed to be formed in a pattern identical to that compartmentalizing the subpixel SP as shown in FIG. 12, for example.

Note that in order to form the partition 6 having a corresponding shape in each of the panel regions 301 and the peripheral region 302, the peripheral region 302 (the region where the protrusion amount D of the partition 6 is measured) should preferably have such a width that at least a plurality of pixels PX (subpixels SP) are compartmentalized from each other. In the example illustrated in FIG. 12, it is assumed that the partition 6 is formed into a pattern that compartmentalizes the pixels PX (the subpixels SP1, SP2 and SP3) in the number of 36 (6×6=36) in the regions marked with "x" in the peripheral region 202. Note here that in the regions marked with "x", for example, the partition 6 may be formed into a pattern that compartmentalize a number of pixels PX in the number such as 100 (10× 10=100). The rib 5 in the peripheral region 302 may be formed in the same pattern as that of the panel regions 301, or may be formed in a pattern different from that of the panel regions 301.

Further, this embodiment is described in connection with the case where the protrusion amount D of the partition 6 formed in the peripheral region 302 is measured. Note here that it is preferable that the measurement of the protrusion amount D of the partition 6 be carried out in all of the regions marked with "x" shown in FIG. 10 while, for example, moving the length-measuring machine camera 100 and the laser processing device 200. With this operation, it is considered to be able to improve the reliability of all display panels (the display devices DSP manufactured therefrom) formed in the plurality of panel regions 301 of the mother substrate 300.

Note here that in order to reduce the load on the measurement of the protrusion amount D of the partition 6, the protrusion amount D of the partition 6 may be measured in some of the regions marked with "x" shown in FIG. 10. In this case, the protrusion amount D of the partition 6 may be measured, for example, in the regions near the four corners of the mother substrate 300 and in the region near the center of the mother substrate 300.

Figure 13:
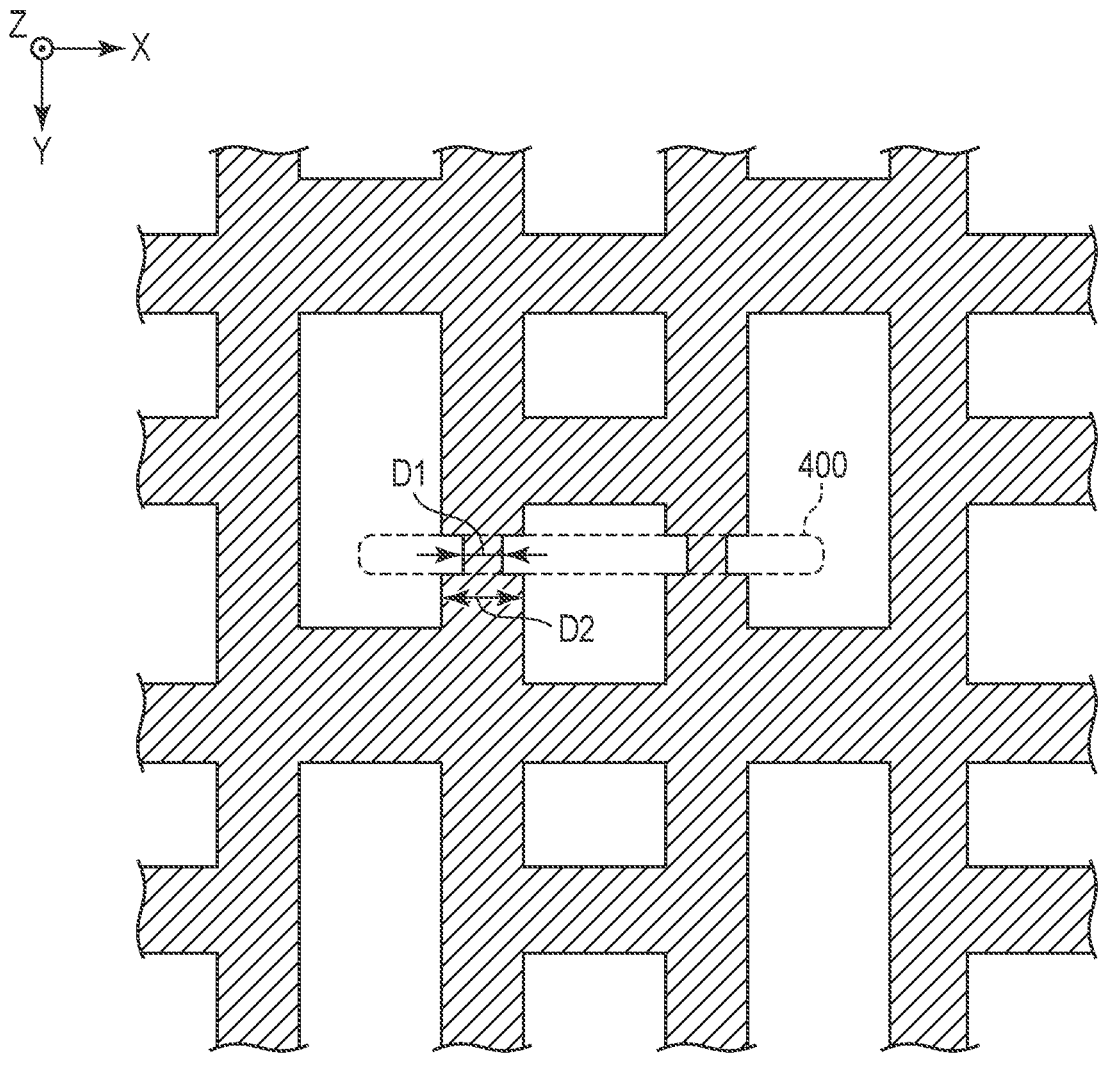
FIG. 13 is a diagram illustrating a region where laser is irradiated to remove an upper portion of the partition.

Further, although, in this embodiment, the protrusion amount D of the partition 6 can be measured by removing the upper portion 62 of the partition 6 formed in the peripheral region 302 using the laser processing device 200, but when measuring the protrusion amount D of the partition 6, it is not necessary to remove all of the upper portions 62 of the partitions formed in the region marked with "x" in the peripheral region 302. More specifically, as shown in FIG. 13, for example, only the upper portion 62 formed in a partial region 400 of the region marked with "x" in the peripheral region 302 should be removed (laser is irradiated only onto the region 400), and then the length-measuring machine camera 100 should be used to capture the image of the range encompassing the region 400, and thus the width D1 of the lower portion 61 and the width D2 of the upper portion 62 can be measured by a single shot.

As described above, in this embodiment, a lower electrode LE is formed on a base 10, a rib 5 covering a part of the lower electrode LE is formed, a partition 6 including a lower portion 61 disposed on the rib 5 and an upper portion 62 protruding from a side surface of the lower portion 61 is formed. Then, the upper portion 62 of at least a part of the partition 6 is removed, the width D1 (first width) of the lower portion 61 of the partition 6 and the width D2 (second width) of the upper portion 62 thereof are measured, and the protrusion amount D of the partition 6 (the distance between the side surface of the lower portion 61 and the end portion of the upper portion 62) is measured based on the width D1 of the lower portion 61 and the width D2 of the upper portion 62.

Note that, this embodiment is explained in connection with the case where the upper portion 62 of the partition 6 is formed of a metal material such as titanium, and the upper portion 62 is removed by laser irradiated from the laser processing device 200, for example. But the removal of the upper portion 62 may be carried out by some other method. Further, it is explained here that the width D1 of the lower portion 61 and the width D2 of the upper portion 62 are measured by, for example, capturing the image thereof by the length-measuring machine camera 100, but the measurement of the width D1 of the lower portion 61 and the width D2 of the upper portion 62 may be conducted by some other method.

As described above, this embodiment has such a structure that the display device DSP can be manufactured in a state where the protrusion amount D of the partition 6 is appropriate. Thus, it is possible to suppress the deterioration of the reliability of the display device DSP.

Note here that it is considered, in order to measure the protrusion amount D of the partition 6, to capture the image of the partition 6 using the length-measuring machine camera 100 from a side of a surface of the base 10 on an opposite side to a surface on which the display elements 20 and the like are disposed (that is, the rear surface). But this embodiment is even more suitable for the cases where such image capture operation of the partition 6 (measuring the protrusion amount D of the partition 6) from a side of the rear surface of the base 10 cannot be carried out.

Furthermore, in this embodiment, a mother base 10 including a plurality of panel regions 301 and a peripheral region 302 which compartmentalizes the panel regions 301 from each other is prepared. Then, the partition 6 is formed on both the plurality of panel regions 301 and the peripheral region 302, and the upper portion 62 of the partition 6 described above is removed, followed by measuring the width D1 of the lower portion 61 and the width D2 of the upper portion 62 (that is, the protrusion amount D of the partition 6) in the peripheral region 302. According to such configuration, it is possible to measure the protrusion amount D of the partition 6 without affecting the quality of the display device DSP (that is, the display panel cut from the mother substrate 300 to manufacture the display device DSP).

When the protrusion amount D of the partition 6 measured as described above is appropriate, an organic layer OR is formed on the lower electrode LE, an upper electrode UE is formed on the organic layer OR, a cap layer CP is formed on the upper electrode, a sealing layer SE is formed on the cap layer CP and a resist R is formed on the sealing layer SE. Then, using the resist R as a mask, the sealing layer SE, the cap layer CP, the upper electrode UE and the organic layer OR are removed and such a process is repeated. In this manner, the display elements 20 of the subpixels SP of various colors can be formed.

When the manufacturing method for the display device DSP described in this embodiment is applied, the mother substrate 300 has such a structure including a base 10 including a plurality of panel regions 301 in which display panels are formed and a peripheral region 302 which compartmentalizes the plurality of panel regions 301, a lower electrode LE disposed on the base 10, a rib 5 which covers a part of the lower electrode LE and compartmentalizes subpixels SP (pixels), and a partition 6 disposed on the rib 5 in the plurality of panel regions 301 and the peripheral region 302. Further, the partition 6 disposed in the plurality of panel regions 301 includes a lower portion 61 disposed on the rib 5 and an upper portion 62 protruding from a side surface of the lower portion 61, and the partition 6 (at least a part thereof) disposed in the peripheral region 302 includes a lower portion 61 disposed on the rib 5 and does not include an upper portion 62. According to this embodiment, a display panel in which a partition 6 with an appropriate protrusion amount D is formed is cut from the mother substrate 300, and a display device DSP can be thus manufactured. Therefore, it is possible to improve the reliability of the display device DSP.

Further, in this embodiment, respective partitions 6 in the panel regions 301 are formed in a pattern that compartmentalizes the subpixels SP. In contrast, the partition 6 in the peripheral region 302 is formed in a pattern identical to that of the partitions 6 formed in the panel regions 301 (that is, it is formed as a dummy pattern that imitates the subpixels SP). With this structure, the partition 6 in this embodiment is formed by, for example, carrying out isotropic wet etching after carrying out anisotropic dry etching, and thus the variation between the etching amount when forming the partitions 6 in the panel regions 301 and the etching amount when forming the partition 6 in the peripheral region 302 can be reduced. Therefore, it is possible to determine whether or not the partitions 6 are properly formed in the panel regions 301 by measuring the protrusion amount D of the partition 6 formed in the peripheral region 302.

All display device manufacturing methods and mother substrates, which are implementable with arbitrary changes in design by a person of ordinary skill in the art based on the display device manufacturing method and mother substrate described above as the embodiments of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be arbitrarily made to the above embodiments by a person of ordinary skill in the art, and these modifications also fall within the scope of the present invention as long as they encompass the spirit of the present invention.

In addition, the other advantages of the aspects described in the above embodiments, which are obvious from the descriptions of the specification or which are arbitrarily conceivable by a person of ordinary skill in the art, are considered to be achievable by the present invention as a matter of course.

What is claimed is:

1. A method of manufacturing a display device, comprising:
    forming a lower electrode on a base;
    forming a rib which covers a part of the lower electrode;

forming a partition including a lower portion disposed on the rib and an upper portion protruding from a side surface of the lower portion;
    removing the upper portion of at least a part of the partition;
    measuring a first width of the lower portion of the partition and a second width of the upper portion of the partition; and
    measuring a distance between the side surface of the lower portion and an end portion of the upper portion based on the first and second widths, wherein
    the upper portion of the partition is formed of a metal material and is removed by a laser irradiated from a laser processing device, and
    the first width is measured based on the top surface of the lower portion exposed by the removing of the upper portion.

2. The method of claim 1, wherein
    the first and second widths are measured by capturing an image thereof with a length-measuring machine camera.

3. The method of claim 1, wherein
    the base includes a plurality of panel regions in which display panels are formed and a peripheral region that compartmentalizes the plurality of panel regions,
    the partition is formed in both the plurality of panel regions and the peripheral region, and
    the removing of the upper portion and the measuring of the first width, the second width and the distance are carried out in the peripheral region.

4. The method of claim 3, wherein
    in the plurality of panel regions, the partition is formed into a pattern that compartmentalizes pixels, and
    in the peripheral region, the partition is formed into a pattern identical to that of the partition formed in the plurality of panel regions.

5. The method of claim 1, further comprising:
    forming an organic layer on the lower electrode after the measuring of the distance;
    forming an upper electrode on the organic layer;
    forming a cap layer on the upper electrode;
    forming a sealing layer on the cap layer;
    forming a resist on the sealing layer; and
    removing the sealing layer, the cap layer, the upper electrode and the organic layer using the resist as a mask.

6. The method of claim 1, wherein
    the partition is formed by carrying out anisotropic dry etching and thereafter isotropic wet etching.

* * * * *